United States Patent [19]

Swart et al.

[11] Patent Number: 5,781,023

[45] Date of Patent: Jul. 14, 1998

[54] HOLLOW PLUNGER TEST PROBE

[75] Inventors: Mark A. Swart, Anaheim Hills; Gordon A. Vinther, Ontario; Byron C. Sanderson, Upland; Charles J. Johnston, Walnut, all of Calif.

[73] Assignee: Delware Capital Formation, Inc., Wilmington, Del.

[21] Appl. No.: 792,658

[22] Filed: Jan. 31, 1997

[51] Int. Cl.⁶ .................................................. G01R 31/02
[52] U.S. Cl. .................................. 324/761; 324/754
[58] Field of Search .......................... 324/761, 754; 439/482

[56] References Cited

U.S. PATENT DOCUMENTS 5,233,290   8/1993   Swart ............................. 324/72.5

FOREIGN PATENT DOCUMENTS

| 68986 A1 | 1/1983 | European Pat. Off. | ........ G01R 1/067 |
| 405323 A2 | 1/1991 | European Pat. Off. | ........ G01R 1/067 |
| 3022394 A1 | 12/1981 | Germany | .................... G01R 1/06 |
| 2243727 A | 11/1991 | United Kingdom | .......... G01R 31/02 |

*Primary Examiner*—Ernest F. Karlsen
*Assistant Examiner*—Anh Phung
*Attorney, Agent, or Firm*—Christie, Parker & Hale, LLP

[57] ABSTRACT

A hollow plunger spring probe assembly for performing tests on an electrical device including a probe receptacle for receipt of the hollow plunger. The plunger includes a tip at one end of the plunger for contacting the electrical device and a spring positioned within the opening in the plunger between the tip and a receptacle post having a head portion extending into the plunger through a second end. The post is rigidly attached to the receptacle. The plunger includes an attachment mechanism for releasably attaching the plunger to the head portion of the post.

22 Claims, 6 Drawing Sheets

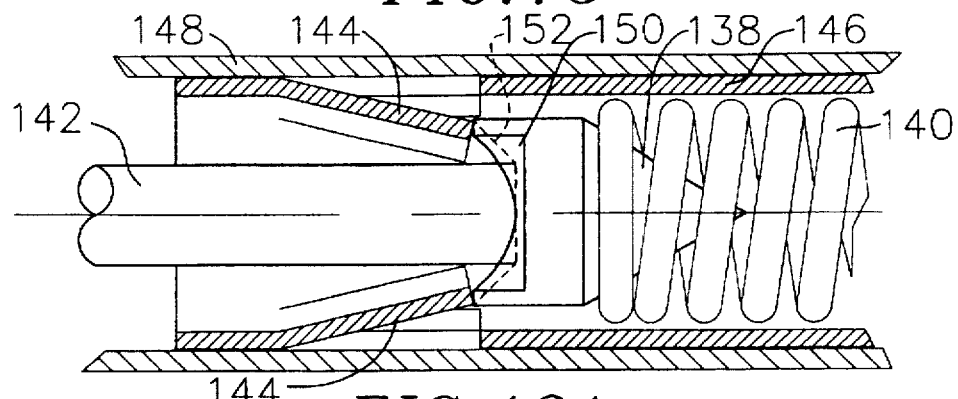
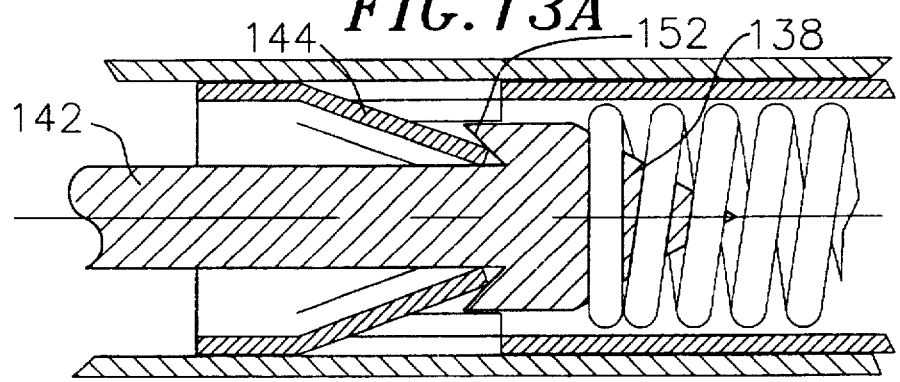
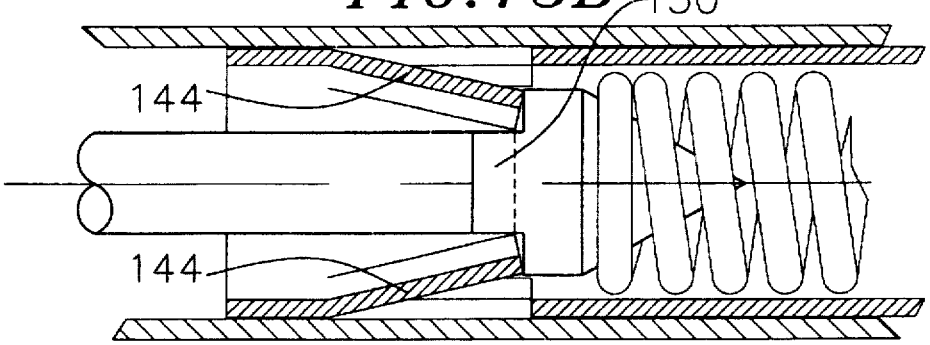
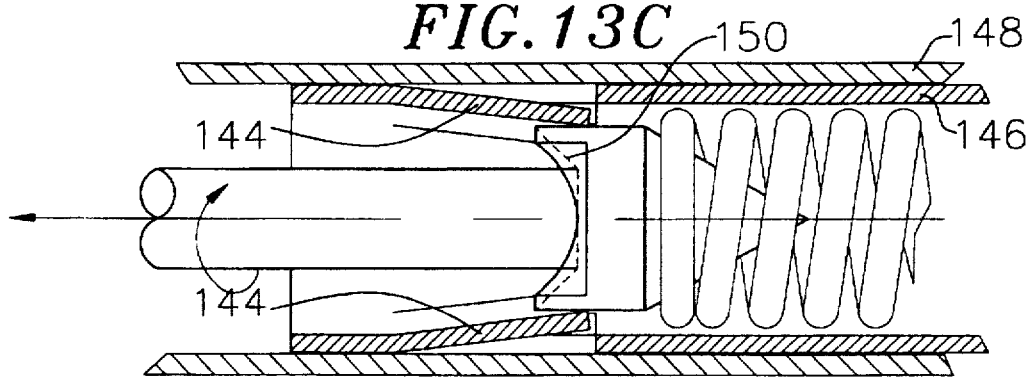

HOLLOW PLUNGER TEST PROBE

FIELD OF THE INVENTION

The present invention relates to electrical contact probes and, more particularly, to spring-loaded contact probes having a hollow plunger assembly used in electrical testing applications such as providing electrical contact between diagnostic or testing equipment and an electrical device under test.

BACKGROUND OF THE INVENTION

Conventional spring-loaded contact probes generally include an outer receptacle, a movable plunger, a barrel containing the plunger, and a spring for biasing the reciprocating travel of the plunger in the barrel. The plunger is commonly biased outwardly a selected distance by the spring and may be biased or depressed inwardly of the barrel, a selected distance, under force directed against the spring. The plunger generally is solid and includes a head or tip for contacting electrical devices under test. Such conventional contact probes are generally referred to herein as three-component probes, since they have a receptacle, barrel and plunger.

In conventional devices, the barrel is mounted within the receptacle with the plunger extending outwardly from the receptacle. Preferably, the barrel is removably-mounted in the receptacle, so that should damage occur to the barrel or plunger, replacement is possible. Usually, the receptacle is permanently or semi-permanently mounted in an array within the tester. Electrical wiring may be attached to the receptacle, for electrical communication between the receptacle and the testing diagnostic equipment. Preferably, the probe member, barrel and receptacle are manufactured from electrically conductive materials, so that an electrical circuit is maintained between the electrical device under test and test equipment, by means of the contact probe.

When such electrical probes are used, generally a contact side of the electrical device to be tested is brought into pressure contact with the tip of the plunger for maintaining spring pressure against the electrical device. After the electrical device has been tested, the pressure exerted by the spring probes is released and the device is removed from contact with the tip of each probe. In conventional systems, the pressure is released by moving the electrical device and probes away from one another, thereby allowing the plungers to be displaced outwardly away from the barrel under the force of the spring within the barrel, until an enlarged-diameter section of the plunger engages a crimped end portion of the barrel.

The process of making a conventional spring probe involves separately producing the compression spring, the barrel and the plunger. The compression spring is wound and heat treated to produce a spring of a precise size and of a controlled spring force. The plunger is typically heat treated and sometimes the barrels are heat treated. All components are subjected to a plating process to enhance conductivity. The spring probe components are assembled either manually or by an automated process. During assembly, the compression spring is first placed in the barrel, the plunger is then inserted into the barrel to compress the spring, and the barrel is roll crimped to retain the plunger. In use, the completed spring probes are commonly inserted into an outer receptacle for retaining the probe in a fixture or the like. The principal cost factors in producing these multi-component probes are the separate manufacturing costs of the components and the assembly time and equipment for producing the finished part.

A problem with conventional spring-loaded contact probes is the undesirably high amount of tip deviation from the desired axial direction. Tip deviation is referred to in the art as Total Indicator Reading (TIR) and it is desirable to have as small a TIR as possible. A high TIR for conventional spring probes is caused due to the plunger floating within the barrel and the barrel floating within the receptacle. The play between these sets of components causes the probe tip to rock within the receptacle.

Another problem associated with conventional spring probes is that the size and strength of the spring capable of being incorporated into the probe is limited due to space limitations within the barrel. Another disadvantage of conventional spring probes is that because of the number of components, they are relatively expensive to manufacture.

An attempt to address TIR with a two component probe was made which incorporated a hollow plunger and a wire-wrap post. This design was not successful because no receptacle was included in the design and consequently there was no bearing surface for the exterior of the plunger. This design also was undesirable because the wire-wrap post needed to be extremely long to attempt to control TIR from the interior of the plunger. TIR was not successfully reduced with this design because the bearing surface within the plunger was relatively short due to the limited amount of space for the plunger to reciprocate with respect to the post. A long post also created a spring force problem. Since there was little room for the spring, an extremely short spring was unable to provide adequate spring force for the plunger to contact the test site. Additionally this design was expensive to manufacture.

Consequently, a need exists for an improved hollow plunger spring probe which eliminates the disadvantages associated with conventional spring-loaded contact probes.

SUMMARY OF THE INVENTION

Briefly, one embodiment of the invention comprises a spring-loaded contact probe for placement within a receptacle for performing electrical tests on a unit under test. The spring-loaded contact probe constructed according to the principles of this invention includes a hollow plunger disposed within the receptacle for slidable axial displacement within the receptacle. The plunger includes a tip at one end position outside the receptacle for electrical contact with the device under test. A wire-wrap post or a receptacle post extends into the plunger through an opening at the opposite end of the plunger. A longer, heavier, spring is positioned within the plunger between the post and the tip. A number of designs are contemplated for retaining a terminal end of the post within the plunger.

The spring probe of the present invention reduces TIR because there is no barrel in the design and consequently no play between the plunger and the barrel or between a barrel and the receptacle. Additionally, because the plunger is hollow and the spring is located within the plunger an increased bearing length between the plunger and the receptacle is provided. This increased bearing length minimizes the play between the plunger and the receptacle. TIR is also reduced because the barrel has been eliminated, thereby allowing a larger diameter plunger which increases the rigidity of the plunger helping to reduce plunger tip rocking. Another advantage realized by the invention is that because the design provides for the incorporation of a longer and heavier spring, more force is capable of being produced for the probe which also increases the useful life of the probe.

Yet another advantage realized by the invention is that by eliminating components the spring probe is easier and cheaper to manufacture and assemble. Manufacturing costs have also been reduced by the present invention by utilizing inexpensive deep draw and punching processes rather than previous expensive processes of lathe and cutting operations. In addition, the electrical path for the spring probe is enhanced by providing less components for the electrical signal to travel through. The electrical path is also increased because of the longer bearing length between the plunger and the receptacle.

These and other advantages of the invention will be more fully understood by reference to the drawings and the following detailed description.

BRIEF DESCRIPTION OF THE DRAWINGS

FIG. 13 is an enlarged detail showing in cross-section an eleventh alternative connection between the terminal post and the plunger;

FIG. 13A is an enlarged detail illustrating the terminal post of FIG. 13 in cross section;

FIG. 13B is an enlarged detail illustrating the connection of FIG. 13 in a second retained position; and FIG. 13C is an enlarged detail illustrating the connection of FIG. 13 in an extraction position.

DETAILED DESCRIPTION

Figure 1:
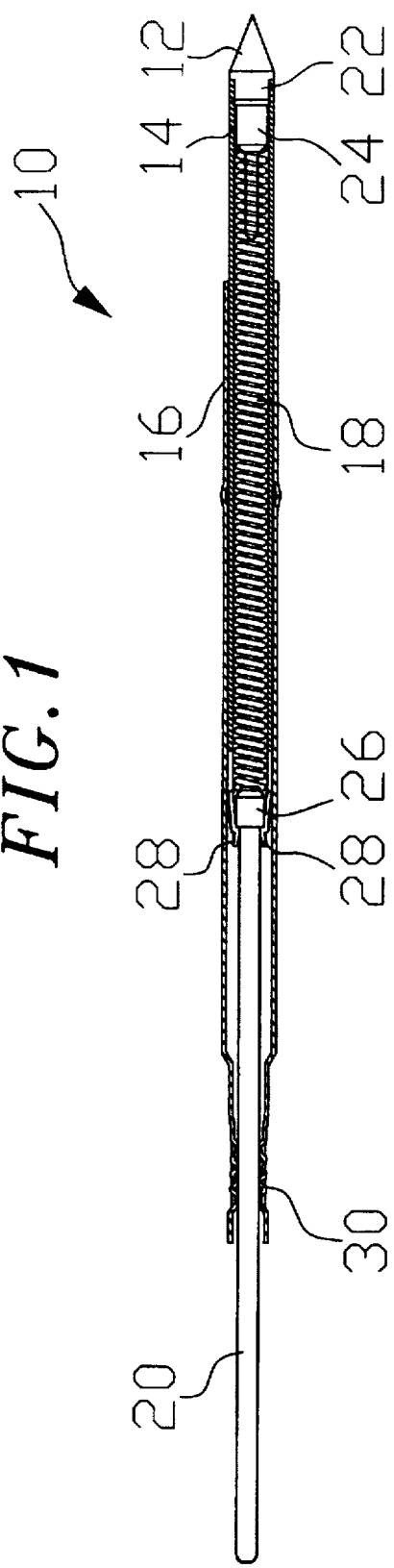
FIG. 1 is a cross-sectional side view of a 100 mil spring probe constructed according to the principals of this invention.

FIG. 1 illustrates a 100 mil spring-loaded test probe 10 used to perform diagnostic electrical tests on an electrical device such as, for example, a printed circuit board. The test probe 10 comprises a head portion or tip 12 at one end of a hollow probe plunger 14. The plunger 14 is mounted within a receptacle 16 so that the tip 12 extends axially away from the receptacle so that it is capable of making contact with the electrical device under test. The probe tip has an end portion configured to facilitate electrical contact with the unit under test and may comprise a number of different geometric configurations such as a single point, multiple point, concave point and the like, depending on the particular configuration of the electrical contacts on the device under test.

The hollow plunger 14 is tubular and circular in cross-section having a generally uniform diameter from end to end forming a long passage for a spring 18. The spring is positioned inside the hollow plunger against the probe tip 12 and a wire-wrap or terminal post 20.

Probe tip 12 includes a reduced shoulder 22 slightly larger than the inside diameter of the hollow plunger so that the probe tip can be press fit within the end of the hollow plunger. The probe tip also has an elongated base 24 extending into the interior of the hollow plunger having a diameter slightly smaller than inside diameter of the plunger. The end of the spring 18 abuts against the elongated base of the probe tip. The opposite end of the spring 18 abuts against an enlarged head portion 26 of the wire-wrap post 20. The head portion is retained within the plunger by spring members 28 formed into the end of the plunger. There are multiple separate spring members formed in the end of the plunger at equal angles with respect to an adjacent spring member and extend around the outer diameter of the wire-wrap post. The head portion of the post snaps past a shoulder portion of the spring members 28 thereby spreading the spring members apart during both insertion and extraction of the plunger.

The wire-wrap post extends axially in a direction opposite to that of the probe tip through a location crimp 30 on the receptacle. The location crimp fixes the axial position of the post with respect to the plunger and rigidly connects the receptacle to the post. The receptacle also includes a press ring 32 for insertion in a hole in a probe plate of a test fixture (not shown) to hold the assembly in the probe plate.

Figure 2:
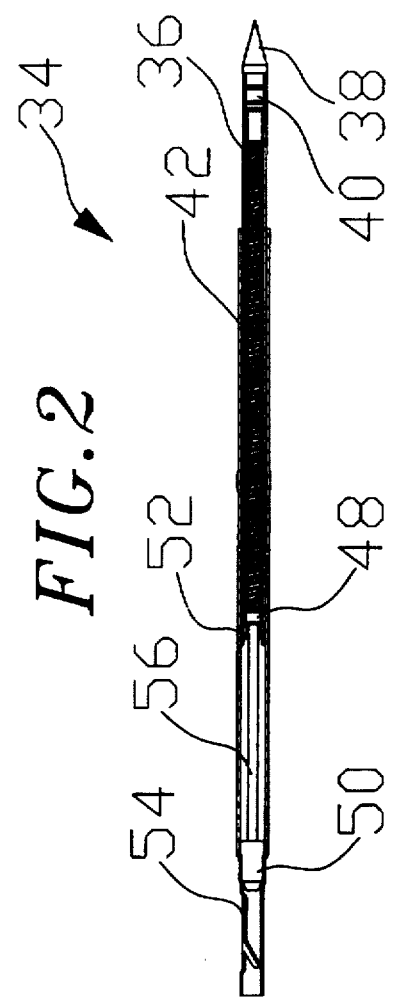
FIG. 2 is a cross-sectional side view of a 50 mil spring probe.

FIG. 2 illustrates a 50 mil spring probe 34 constructed in accordance with the principles of this invention. The 50 mil spring probe assembly similarly comprises a hollow plunger 36 having a probe tip 38 extending axially outwardly from the end of the plunger. Tip 38 includes a reduced shoulder section 40 having a diameter slightly larger than inner diameter of the hollow plunger so that the tip can be press fit to the end of the hollow plunger. The probe tip similarly may comprise a number of different geometric configurations such as a single point, multiple point, concave point and the like depending upon the particular configuration of the test pads for the unit under test.

The hollow plunger is positioned within a tubular receptacle 42 such that the tip extends axially away from the receptacle. A spring 44 is positioned within the hollow plunger and extends between an elongated base of the tip 46 and a head portion 48 of a terminal post 50. The head portion 48 is roll closed 52 into the rear portion of the hollow plunger. The assembly comprising the hollow plunger, probe tip, spring, and terminal post is press fit into the receptacle at a termination location 54. The terminal post includes an enlarged base portion 56 which anchors the assembly to the receptacle at the termination location. The probe operates by contacting the probe tip into the test pad on the unit under test, thereby compressing the spring between the elongated base 46 and the head portion 48 of the terminal post. Axial travel of the plunger within the receptacle is possible as the spring is compressed until the end of the plunger contacts the base of the terminal post.

The hollow plunger and the receptacle are made of an electrically conductive material such as copper or a metal alloy such as beryllium-copper and are formed by a deep draw process known in the art. Additionally, the metal selected to form the plunger and receptacle may be plated with a material having properties of enhanced electrical conductivity such as gold to improve the electrical conductivity of the spring probe. The spring is of the type used with conventional spring probes except that it is longer and heavier and is made form an electrically conductive material such as metal or a metal alloy. It is desired that the spring provide a predetermined degree of compression force to the plunger to facilitate slidable axial displacement within the receptacle and impose a sufficient compression force between the probe tip and the test pad. Although the spring is electrically conductive, the electrical path of the spring probe of the present invention is enhanced over previous spring probes by providing for the electrical signal to pass directly from the plunger to the receptacle or from the plunger to the terminal post.

Figure 3:
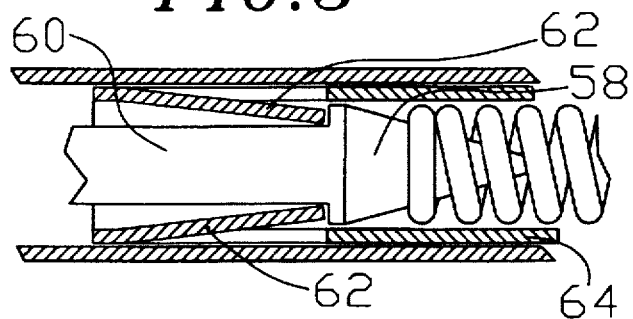
FIG. 3 is an enlarged detail illustrating in cross-section a first alternative connection between the terminal post and the plunger in an insertion position.
Figure 3A:
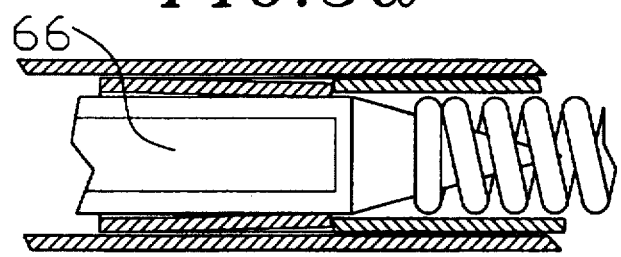
FIG. 3A is an enlarged detail illustrating the connection of FIG. 3 in an extraction position.

Various alternative configurations for connection of the plunger to the terminal post are illustrated in FIGS. 3–12. In FIGS. 3 and 3A, the head portion 58 of the terminal post 60 snaps past spring members 62 in the plunger 64 during insertion of the plunger. The spring members are fingers formed by a punching process in the end of the plunger and are bent inwardly toward the terminal post and extend into recesses 66 formed in the terminal post. To remove the plunger, the plunger is rotated forcing the fingers out of the recess thereby spreading the spring members for extraction of the plunger from the receptacle.

Figure 4:
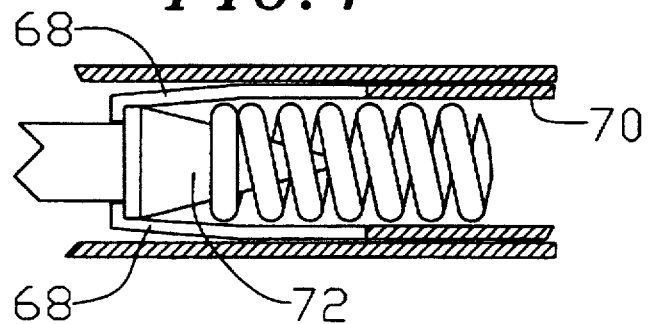
FIG. 4 is an enlarged detail showing in cross-section a second alternative connection between the receptacle post and the plunger.
Figure 5:
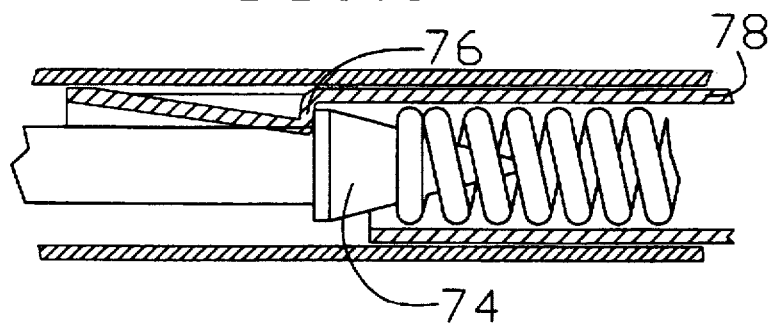
FIG. 5 is an enlarged detail showing in cross-section a third alternative connection between the receptacle post and the plunger.
Figure 6:
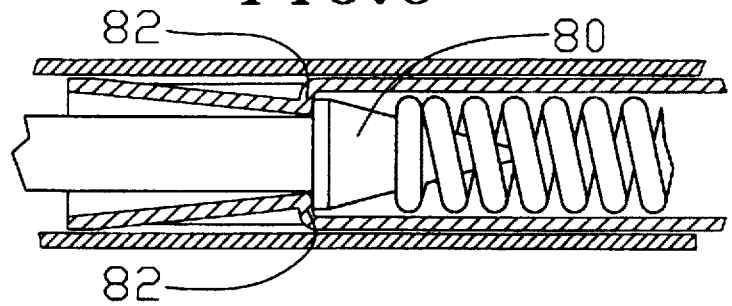
FIG. 6 is an enlarged detail showing in cross-section a fourth alternative connection between the terminal post and the plunger.

FIG. 4 illustrates a method of attachment wherein four spring members 68 consisting of L-shaped hooks are formed on the end of the plunger 70 and are bent inwardly towards the terminal post. The spring members snap around the head portion 72 during both insertion and extraction of the plunger. In FIG. 5 the head portion 74 of the terminal post snaps past a single wedge shaped detent 76 formed in the end of the plunger 78 during insertion of the plunger. The plunger can move past the single wedge shaped detent during removal of the plunger through an opening in the plunger provided by removal of half of the plunger on the opposite side of the detent. FIG. 6 illustrates an attachment design wherein the terminal post head portion 80 snaps past wedge shaped detents 82 at the end of the plunger on both sides of the plunger.

Figure 7:
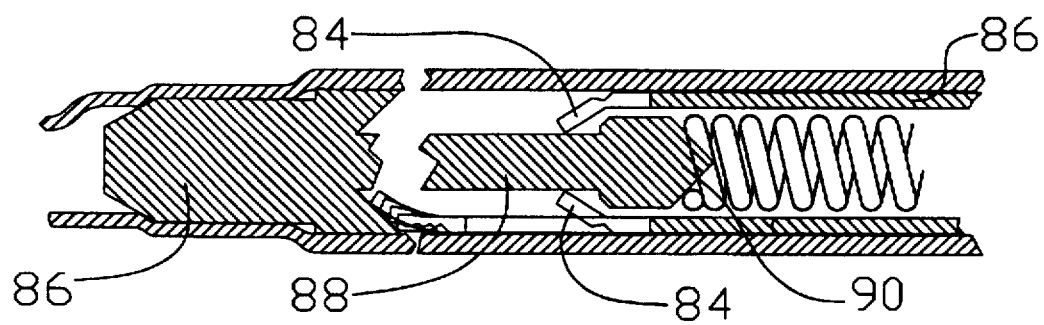
FIG. 7 is an enlarged detail showing in cross-section a fifth alternative connection between the receptacle post and the plunger.
Figure 8:
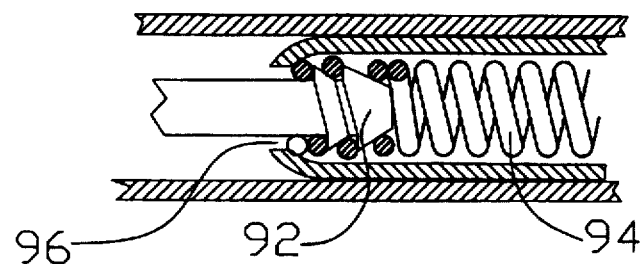
FIG. 8 is an enlarged detail illustrating in cross-section a sixth alternative connection between the receptacle post and the plunger.

In FIG. 7 tabs 84 are located on the end of the plunger 86 and are swaged closed around the head portion 90 against the base 86 of the terminal post 88 at the bottom of the initial insertion stroke of the plunger. The tabs are then bent open upon extraction of the plunger from the receptacle. In FIG. 8 a threaded head portion 92 of the terminal post is threaded into the inside diameter of the spring 94 through an opening 96 in the end of the plunger. The terminal post or the wire-wrap post preloads the spring within the plunger.

Figure 9:
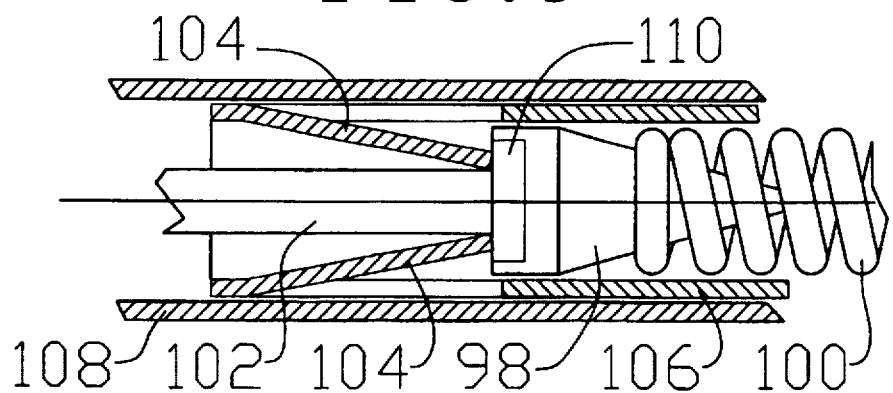
FIG. 9 is an enlarged detail showing in cross-section a seventh alternative connection between the terminal post and the plunger in an insertion position.
Figure 9A:
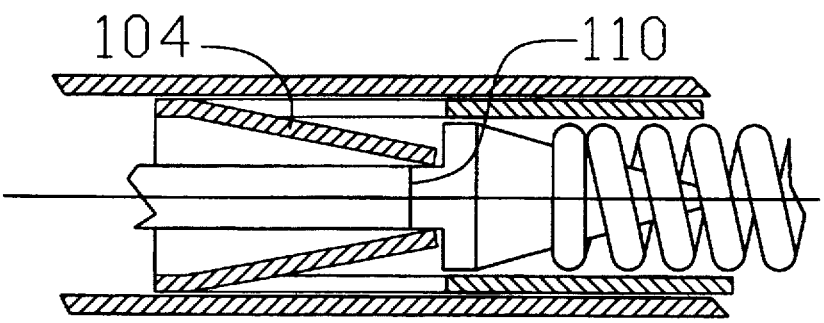
FIG. 9A is an enlarged detail illustrating the connection of FIG. 9 in a second insertion position.
Figure 9B:
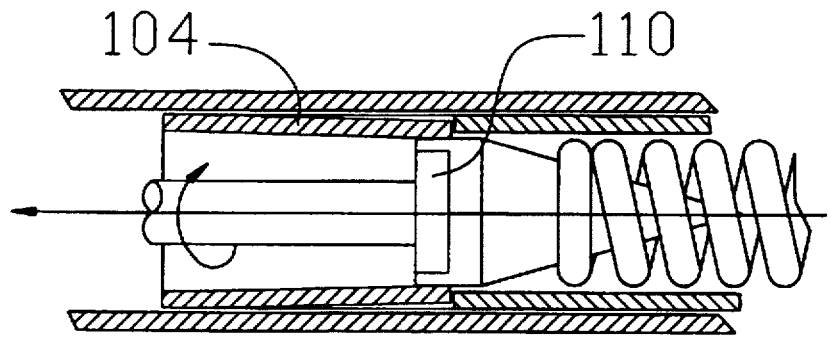
FIG. 9B is an enlarged detail illustrating the connection of FIG. 9 in an extraction position.

Another alternative connection between the terminal post and the plunger is shown in FIGS. 9 through 9B. In FIG. 9 the head portion 98, which extends into spring 100, of terminal post 102 snaps past spring members 104 in the plunger 106 during insertion of the plunger within the receptacle 108. The spring members 104 are fingers formed by a punching process in the end of the plunger and are bent inwardly toward the terminal post and abut against a cam 110 formed on the terminal post adjacent the head 98. To remove the plunger, the plunger is first rotated 90o to the retained position shown in FIG. 9A. In this position, the plunger is compressed downwardly so that the spring members 104 are positioned along the sides of cam 110. Once in this position, the plunger is rotated an additional 90o as shown in FIG. 9B, whereby the cam 110 spreads the finger elements 104 thereby allowing extraction of the plunger from the receptacle.

Figure 10:
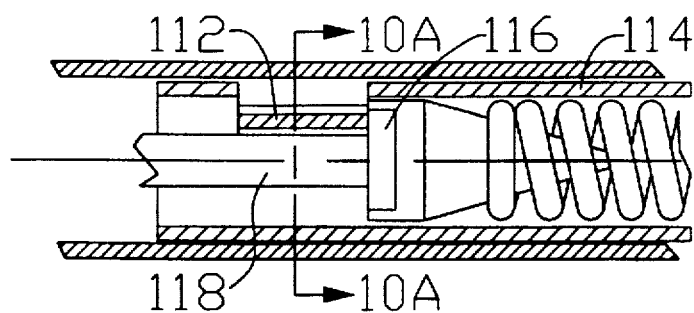
FIG. 10 is an enlarged detail showing in cross-section an eight alternative connection between the terminal post and the plunger.
Figure 10A:
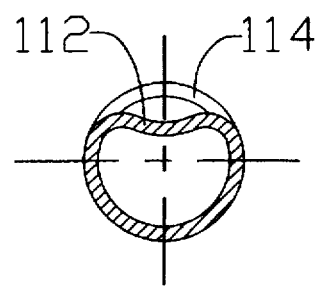
FIG. 10A is a cross-section view of the plunger taken along line 10A—10A of FIG. 10.
Figure 11:
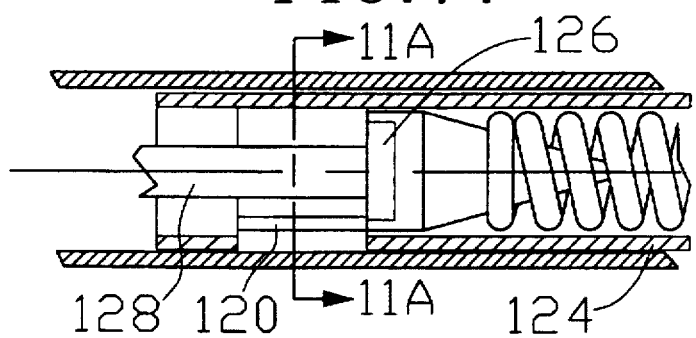
FIG. 11 is an enlarged detail showing in cross-section a ninth alternative connection between the terminal post and the plunger.
Figure 11A:
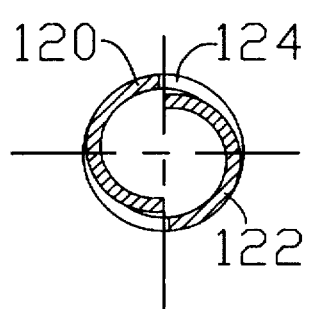
FIG. 11A is a cross-section view of the plunger taken along line 11A—11A of FIG. 11.
Figure 12:
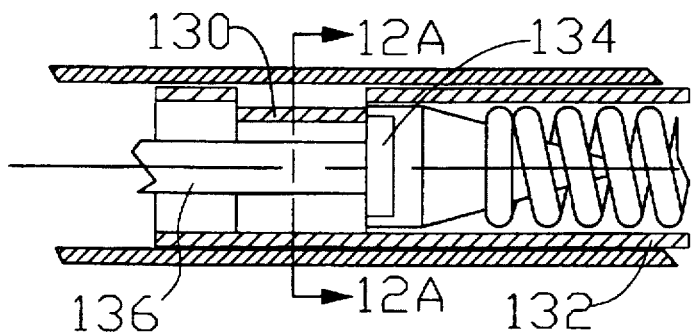
FIG. 12 is an enlarged detail showing in cross-section a tenth alternative connection between the terminal post and the plunger.
Figure 12A:
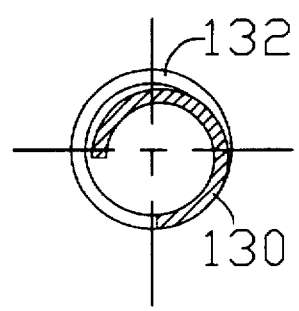
FIG. 12A is a cross-section view of the plunger taken along line 12A—12A of FIG. 12.

FIGS. 10 through 12 illustrate yet other methods of forming a connection between the terminal post and the plunger. In FIGS. 10 and 10A a single circumferential spring indentation retainer 112 is punched along an end of the plunger 114 which rests against a cam 116 positioned on the terminal post 118 in the retained position. In FIGS. 11 and 11A two circumferential spring retainers 120 and 122 are punched along the end of the plunger 124 and rest against the cam 126 formed on the terminal post 128 in the retained position. In FIGS. 12 and 12A a single circumferential spring retainer 130 is formed in the end of the plunger 132 which rests against a cam 134 formed on terminal post 136 in the retained position. In each of the embodiments illustrated in FIGS. 10 through 12, the plunger can be removed from the receptacle by rotating the plunger so that the cam spreads the retainer allowing extraction of the plunger from the receptacle.

The most preferred connection between the terminal post and the plunger is shown in FIGS. 13 through 13C. In FIG. 13 the head portion 138, which extends into spring 140, of terminal post 142 snaps passed spring members 144 in the plunger 146 during insertion of the plunger within the receptacle 148 similar to the design of FIG. 9. The spring members 144 are fingers or tangs formed by a punching process in the end of the plunger and are bent inwardly toward the terminal post and abut against a cam 150 formed on the terminal post and having an angled surface 152 extending towards the terminal post. FIG. 13A is a view identical to FIG. 13 except the terminal post 142 and head portion 138 are shown in cross section to clearly illustrate the angled surface 152. The angled surface 152 ensures that the tangs 144 are securely held behind the head portion 138 which prevents the plunger from walking out of the receptacle. To remove the plunger, the plunger is first rotated 90 degrees to the second retained position shown in FIG. 13B. In this position the spring members 144 are positioned along the sides of the cam 150. Once in this position, the plunger is rotated an additional 90 degrees as shown in FIG. 13C, whereby the cam 150 spreads the tangs 144 thereby allowing extraction of the plunger 146 from the receptacle 148.

The spring probes of the present invention reduce Total Indicator Reading (TIR) thus minimizing the probe tip rocking within the receptacle due to the increased bearing length between the plunger and the receptacle. TIR is also reduced by providing a stiffer plunger due to its larger diameter and length as compared to conventional spring probes. The spring probes of the present invention are also cheaper to manufacture and assemble due to the elimination of barrel components.

Although the present invention has been described and illustrated to respect to multiple embodiments thereof, it is to be understood that it is not to be so limited, since changes and modifications may be made therein which are within the full intended scope of this invention as hereinafter claimed.

What is claimed is:

1. A spring probe assembly for performing tests on an electrical device, the spring probe assembly comprising:

a tubular electrically conductive probe receptacle;

an elongated plunger having an opening extending axially through the plunger wherein the plunger is adapted to be axially slidable within the probe receptacle through a first end of the receptacle;

a probe tip disposed within the opening at a first end of the plunger;

a post fixedly disposed within the probe receptacle at an opposite end of the receptacle, the post having a head portion extending into the opening of the plunger through an opposite second end of the plunger;

a spring disposed within the opening of the plunger between the probe tip and the head portion of the post; and means for providing releasable attachment of the head portion of the post with the second end of the plunger, the means being integral with the second end of the plunger and being adapted to accommodate relative travel between the receptacle and the plunger during spring biased reciprocating travel of the plunger.

2. The spring probe of claim 1 wherein the means for providing releasable attachment of the post with the plunger comprises at least one spring member extending radially outward from the second end of the plunger wherein the spring member includes a shoulder portion cooperating with the head portion of the post.

3. The spring probe of claim 1 wherein the means for providing releasable attachment of the post with the plunger comprises a roll closed portion of the second end of the plunger around the head portion of the post and a base portion of the post press fit into the receptacle.

4. The spring probe as recited in claim 1 wherein the means for providing releasable attachment of the post with the plunger comprises at least one finger element formed in the second end of the plunger bent inwardly toward the post, and at least one recess formed in the post for receipt of the finger element.

5. The spring probe as recited in claim 1 wherein the means for providing releasable attachment of the post with the plunger comprises at least one wedge shaped detent formed in the second end of the plunger cooperating with the head portion of the post.

6. The spring probe of claim 5 wherein there are two wedged shaped detents formed in the second end of the plunger cooperating with the head portion of the post.

7. The spring probe as recited in claim 1 wherein the means for providing releasable attachment of the post with the plunger comprises at least one finger element formed in the second end of the plunger bent inwardly toward the post, and a cam formed on the post.

8. The spring probe as recited in claim 1 wherein the means for providing releasable attachment of the post with the plunger comprises at least two tabs formed in the second end of the plunger, the tabs being swaged closed at the bottom of the initial insertion stroke of the plunger into the receptacle and bent open upon extraction of the plunger from the receptacle.

9. The spring probe as recited in claim 1 wherein the head portion of the post is threaded into an inside diameter of the spring through an opening in the second end of the plunger.

10. A spring probe and probe receptacle assembly for performing tasks on an electrical device, the assembly comprising:

an electrically conductive probe receptacle having an axial opening extending there through;

a plunger having an axial opening there through, wherein a portion of the plunger is slidably displaced within a first end of the receptacle;

a plunger tip at one end of the plunger for contacting an electrical contact of an electrical device;

a post partially positioned within an opening at a second end of the plunger opposite from the tip wherein the post is fixedly attached to the receptacle and includes a head portion that extends into a second end of the plunger;

a spring within the opening in the plunger and interposed between the tip and the head portion of the post; and means for releasable attaching the head portion of the post and the second end of the plunger.

11. The spring probe of claim 10 wherein the end of the receptacle adjacent the post is crimped to limit outwardly directed axial displacement of the plunger from the receptacle.

12. The spring probe of claim 10 wherein the means for providing releasable attachment of the post with the plunger comprises at least one spring member extending radially outward from the second end of the plunger wherein the spring member includes a shoulder portion cooperating with the head portion of the post.

13. The spring probe of claim 10 wherein the means for providing releasable attachment of the post with the plunger comprises a roll closed portion of the second end of the plunger around the head portion of the post and a base portion of the post press fit into the receptacle.

14. The spring probe as recited in claim 10 wherein the means for providing releasable attachment of the post with the plunger comprises at least one finger element formed in the second end of the plunger bent inwardly toward the post, and at least one recess formed in the post for receipt of the finger element.

15. The spring probe as recited in claim 10 wherein the means for providing releasable attachment of the post with the plunger comprises at least one wedge shaped detent formed in the second end of the plunger cooperating with the head portion of the post.

16. The spring probe of claim 15 wherein there are two wedged shaped detents formed in the second end of the plunger cooperating with the head portion of the post.

17. The spring probe as recited in claim 10 wherein the means for providing releasable attachment of the post with the plunger comprises at least one finger element formed in the second end of the plunger bent inwardly toward the post, and a cam formed on the post.

18. The spring probe as recited in claim 10 wherein the means for providing releasable attachment of the post with the plunger comprises at least two tabs formed in the second end of the plunger, the tabs being swaged closed at the bottom of the initial insertion stroke of the plunger into the receptacle and bent open upon extraction of the plunger from the receptacle.

19. The spring probe as recited in claim 7 wherein the cam includes means for preventing the plunger from walking out of the probe receptacle.

20. The spring probe as recited in claim 19 wherein the means for preventing the plunger from walking out of the probe receptacle is an angled surface on the cam for urging the finger element towards the receptacle post.

21. The spring probe as recited in claim 17 wherein the cam includes means for preventing the plunger from walking out of the probe receptacle.

22. The spring probe as recited in claim 21 wherein the means for preventing the plunger from walking out of the probe receptacle is an angled surface on the cam for urging the finger element towards the receptacle post.

* * * * *

UNITED STATES PATENT AND TRADEMARK OFFICE
CERTIFICATE OF CORRECTION

PATENT NO. : 5,781,023
DATED : July 14, 1998
INVENTOR(S) : Mark A. Swart, et. al.

It is certified that error appears in the above-identified patent and that said Letters Patent is hereby corrected as shown below:

Column 6, line change "900" to --$90^{\circ}$--.

Column 6, line 12, change "900" to $90^{\circ}$--.

Signed and Sealed this

Ninth Day of February, 1999

Attest:

Attesting Officer

Acting Commissioner of Patents and Trademarks